US009277634B2

(12) United States Patent
Delgado

(10) Patent No.: US 9,277,634 B2
(45) Date of Patent: Mar. 1, 2016

(54) APPARATUS AND METHOD FOR MULTIPLEXED MULTIPLE DISCHARGE PLASMA PRODUCED SOURCES

(71) Applicant: KLA-Tencor Corporation, Milipitas, CA (US)

(72) Inventor: Gildardo Delgado, Livermore, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 228 days.

(21) Appl. No.: 14/153,536

(22) Filed: Jan. 13, 2014

(65) Prior Publication Data

US 2014/0197733 A1 Jul. 17, 2014

Related U.S. Application Data

(60) Provisional application No. 61/753,869, filed on Jan. 17, 2013.

(51) Int. Cl.
*H01J 37/32* (2006.01)
*H05G 2/00* (2006.01)

(52) U.S. Cl.
CPC .................................... *H05G 2/003* (2013.01)

(58) Field of Classification Search
USPC .............. 315/111.21, 111.41, 111.51, 111.91
See application file for complete search history.

(56) References Cited

U.S. PATENT DOCUMENTS 4,649,534 A * 3/1987 Manjarres ............... H04L 12/56 370/389
5,307,369 A 4/1994 Kimberlin
5,598,197 A * 1/1997 Zaba .................... B41J 2/16526 347/22
6,014,401 A 1/2000 Godard et al.
6,414,438 B1 7/2002 Borisov et al.
6,946,669 B2 9/2005 Kleinschmidt
7,071,476 B2 * 7/2006 Rothweiler ............ B82Y 10/00 250/492.2
7,183,565 B2 * 2/2007 Goldstein ............. G03F 7/7005 250/504 R
7,183,717 B2 2/2007 Smith et al.
7,288,777 B2 * 10/2007 Partlo ..................... B82Y 10/00 250/504 R
7,329,886 B2 2/2008 Singer et al.
7,405,416 B2 * 7/2008 Algots ................... H05G 2/003 222/591
7,838,854 B2 * 11/2010 Algots ................... H05G 2/003 250/504 R
8,759,804 B2 * 6/2014 Nishisaka .............. G03B 27/54 250/504 R (Continued)

*Primary Examiner* — Tung X Le
*Assistant Examiner* — Srinivas Sathiraju
(74) *Attorney, Agent, or Firm* — Simpson & Simpson, PLLC

(57) ABSTRACT

An apparatus for producing EUV light, including: a plate with pluralities of through-bores; at least one power system; and a plurality of discharge plasma devices disposed in the through-bores. Each device includes: a respective plasma electrode forming at least part of a respective plasma-producing region; a respective magnetic core embedded in the plate and aligned with the respective plasma electrode in a radial direction and configured to create a respective magnetic field within the respective plasma-producing region; and a respective feed system arranged to supply an ionizable material to the respective plasma-producing region. The power system is configured to supply electrical power to the plasma electrodes to create respective electric fields in the respective plasma-producing regions. The combination of the respective electric field and the respective magnetic fields is arranged to create respective plasma from the ionizable material, the respective plasma creating respective EUV light.

38 Claims, 4 Drawing Sheets

(56) References Cited

U.S. PATENT DOCUMENTS

2003/0053588 A1* 3/2003 Kondo ................... B82Y 10/00 378/34
2006/0017387 A1 1/2006 Smith et al.
2006/0192154 A1* 8/2006 Algots ................... H05G 2/003 250/504 R
2008/0283776 A1* 11/2008 Algots ................... H05G 2/003 250/492.1
2010/0176313 A1 7/2010 Melnychuk et al.
2012/0236281 A1 9/2012 Wang et al.
2012/0274924 A1* 11/2012 Delgado .............. G01N 21/956 356/72
2013/0063803 A1* 3/2013 Delgado ............. G03F 7/70033 359/278
2013/0242295 A1 9/2013 Wang et al.
2013/0270461 A1* 10/2013 Delgado .................. G21K 5/10 250/505.1
2013/0271827 A1* 10/2013 Delgado .................. G21K 5/10 359/361
2014/0004025 A1* 1/2014 Zhuang .................... B01J 19/08 423/210

* cited by examiner

APPARATUS AND METHOD FOR MULTIPLEXED MULTIPLE DISCHARGE PLASMA PRODUCED SOURCES

CROSS-REFERENCE TO RELATED APPLICATIONS

This application claims the benefit under 35 U.S. C. §119(e) of U.S. Provisional Patent Application No. 61/753,869, filed Jan. 17, 2013, which application is incorporated herein by reference in its entirety.

TECHNICAL FIELD

The present disclosure relates to an apparatus and method for generating extreme ultra-violet light using a plurality of multiplexed discharge plasma produced sources.

BACKGROUND

It is known to use discharge plasma produced sources to generate extreme ultra-violet (EUV) light for use in lithography systems. Reticle inspection system light source requirements are different than source requirements for lithography systems. As a result, for technical and economic cost reasons, typical EUV light sources for lithography systems do not meet the inspection light source requirements for reticle inspection systems. From a technical point, the brightness of EUV lithography discharge plasma produced sources do not have the brightness or size required for reticle inspection systems. Also, the repetition rates for individual discharge plasma produced sources are too low for use in reticle inspection systems.

It also is known to use a single discharge plasma produced source per light source system. Therefore, to increase EUV light output, it is necessary to install multiple light source systems, increasing the overall footprint of a system in which the multiple light sources are installed.

SUMMARY

According to aspects illustrated herein, there is provided an apparatus for producing extreme ultra-violet (EUV) light, including: a plate including a first plurality of through-bores, each through-bore included in the first plurality of through-bores including a respective longitudinal axis; a plurality of discharge plasma devices, each discharge plasma device at least partially disposed in a respective through-bore included in the first plurality of through-bores and including a respective plasma electrode at least partially forming a respective plasma-producing region, a respective magnetic core embedded in the plate and aligned with at least a portion of the respective plasma electrode in a radial direction and configured to create a respective magnetic field within the respective plasma-producing region, and a respective feed system arranged to supply an ionizable material to the respective plasma-producing region; and at least one power system configured to supply electrical power to the respective plasma electrodes to create respective first electric fields in the respective plasma-producing regions. For said each discharge plasma device, the combination of a respective first electric field and the respective magnetic field is arranged to create a respective plasma from the ionizable material, the respective plasma creating respective EUV light.

According to aspects illustrated herein, there is provided an apparatus for producing extreme ultra-violet (EUV) light, including: a plate including a first plurality of through-bores, each through-bore included in the first plurality of through-bores including a respective longitudinal axis; a plurality of discharge plasma devices, each discharge plasma device at least partially disposed in a respective through-bore included in the first plurality of through-bores and including a respective plasma electrode at least partially forming a respective plasma-producing region, a respective magnetic core embedded in the plate, aligned with at least a portion of the respective plasma electrode in a radial direction orthogonal to the respective longitudinal axis, wholly surrounding the at least a portion of the respective first electrode in a circumferential direction, and configured to create a respective magnetic field within the respective plasma-producing region; and a respective feed system arranged to supply an ionizable material to the respective plasma-producing region; at least one power system configured to supply electrical power to the respective plasma electrodes to create respective first electric fields in the respective plasma-producing regions; and a control system configured to operate the at least one power system to simultaneously provide electrical power to all of the respective plasma electrodes, or provide electrical power to the respective plasma electrodes in a predetermined sequence. For each discharge plasma device, the combination of a respective first electric field and the respective magnetic field is arranged to create respective plasma from the ionizable material, the respective plasma creating respective EUV light.

According to aspects illustrated herein, there is provided a method for producing extreme ultra-violet (EUV) light, using an apparatus including a plate including a first plurality of through-bores, each through-bore included in the first plurality of through-bores including a respective longitudinal axis and a first plurality of discharge plasma devices, each discharge plasma device at least partially disposed in a respective through-bore included in the first plurality of through-bores and including a respective plasma electrode at least partially forming a respective plasma-producing region, the method including, for each discharge plasma device: creating, using a respective magnetic core embedded in the plate and aligned with at least a portion of the respective plasma electrode in a radial direction orthogonal to the respective longitudinal axis, a respective magnetic field within the respective plasma-producing region; supplying, using a respective feed system, an ionizable material to the respective plasma-producing region; supplying, using at least one power system, electrical power to the respective plasma electrodes; creating respective first electric fields in the respective plasma-producing regions; ionizing the ionizable material to the respective plasma-producing regions; creating, from the ionizable material, respective plasma in the respective plasma-producing regions; and creating, from the respective plasma, respective EUV light.

BRIEF DESCRIPTION OF THE DRAWINGS

Various embodiments are disclosed, by way of example only, with reference to the accompanying schematic drawings in which corresponding reference symbols indicate corresponding parts, in which.

DETAILED DESCRIPTION

At the outset, it should be appreciated that like drawing numbers on different drawing views identify identical, or functionally similar, structural elements of the disclosure. It is to be understood that the disclosure as claimed is not limited to the disclosed aspects.

Furthermore, it is understood that this disclosure is not limited to the particular methodology, materials and modifications described and as such may, of course, vary. It is also understood that the terminology used herein is for the purpose of describing particular aspects only, and is not intended to limit the scope of the present disclosure.

Unless defined otherwise, all technical and scientific terms used herein have the same meaning as commonly understood to one of ordinary skill in the art to which this disclosure belongs. It should be understood that any methods, devices or materials similar or equivalent to those described herein can be used in the practice or testing of the disclosure.

Unless defined otherwise, all technical and scientific terms used herein have the same meaning as commonly understood to one of ordinary skill in the art to which this present disclosure belongs. It should be appreciated that the term "substantially" is synonymous with terms such as "nearly", "very nearly", "about", "approximately", "around", "bordering on", "close to", "essentially", "in the neighborhood of", "in the vicinity of", etc., and such terms may be used interchangeably as appearing in the specification and claims. It should be appreciated that the term "proximate" is synonymous with terms such as "nearby", "close", "adjacent", "neighboring", "immediate", "adjoining", etc., and such terms may be used interchangeably as appearing in the specification and claims. Although any methods, devices or materials similar or equivalent to those described herein can be used in the practice or testing of the present disclosure, the preferred methods, devices, and materials are now described.

Figure 1A:
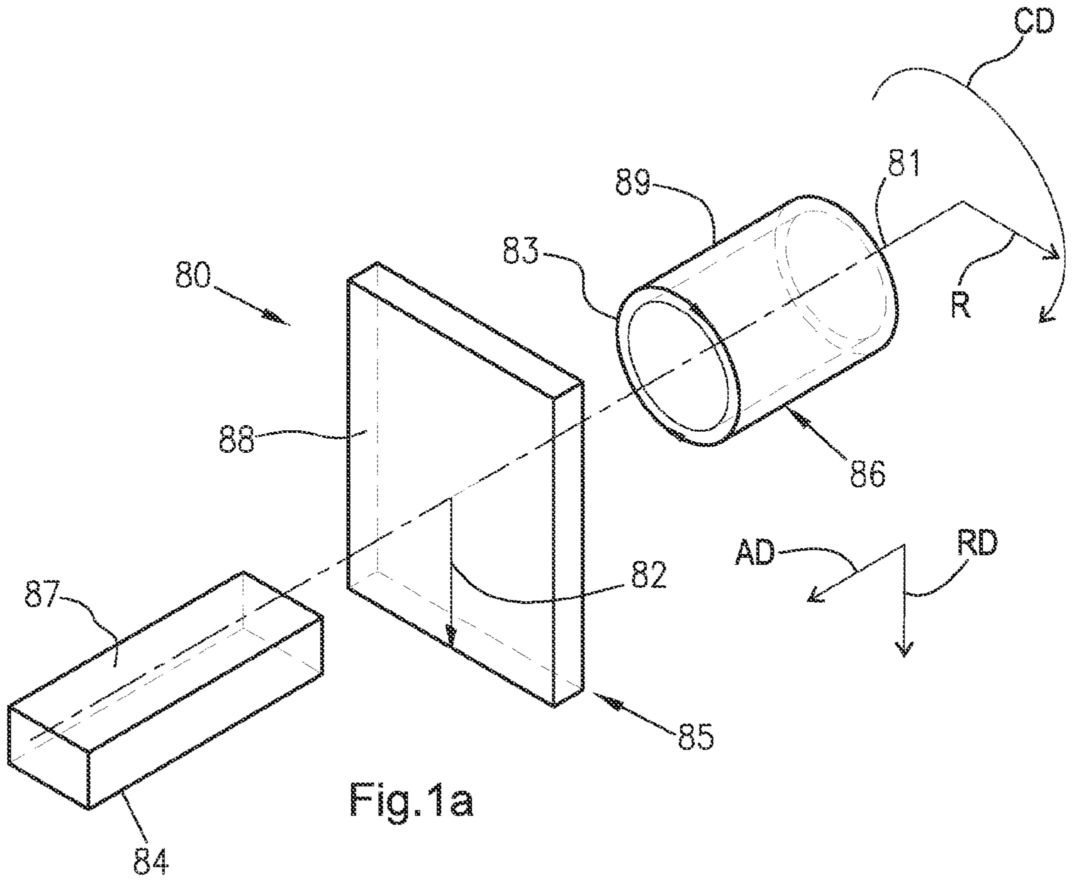
FIG. 1A is a perspective view of a cylindrical coordinate system demonstrating spatial terminology used in the present application.

FIG. 1A is a perspective view of cylindrical coordinate system 80 demonstrating spatial terminology used in the present application. The present invention is at least partially described within the context of a cylindrical coordinate system. System 80 has a longitudinal axis 81, used as the reference for the directional and spatial terms that follow. Axial direction AD is parallel to axis 81. Radial direction RD is orthogonal to axis 81. Circumferential direction CD is defined by an endpoint of radius R (orthogonal to axis 81) rotated about axis 81.

To clarify the spatial terminology, objects 84, 85, and 86 are used. Surface 87 of object 84 forms an axial plane. For example, axis 81 is congruent with surface 87. Surface 88 of object 85 forms a radial plane. For example, radius 82 is congruent with surface 88. Surface 89 of object 86 forms a circumferential surface. For example, circumference 83 is congruent with surface 89. As a further example, axial movement or disposition is parallel to axis 81, radial movement or disposition is orthogonal to axis 82, and circumferential movement or disposition is parallel to circumference 83. Rotation is with respect to axis 81.

The adverbs "axially," "radially," and "circumferentially" are with respect to an orientation parallel to axis 81, radius 82, or circumference 83, respectively. The adverbs "axially," "radially," and "circumferentially" also are regarding orientation parallel to respective planes.

Figure 1B:
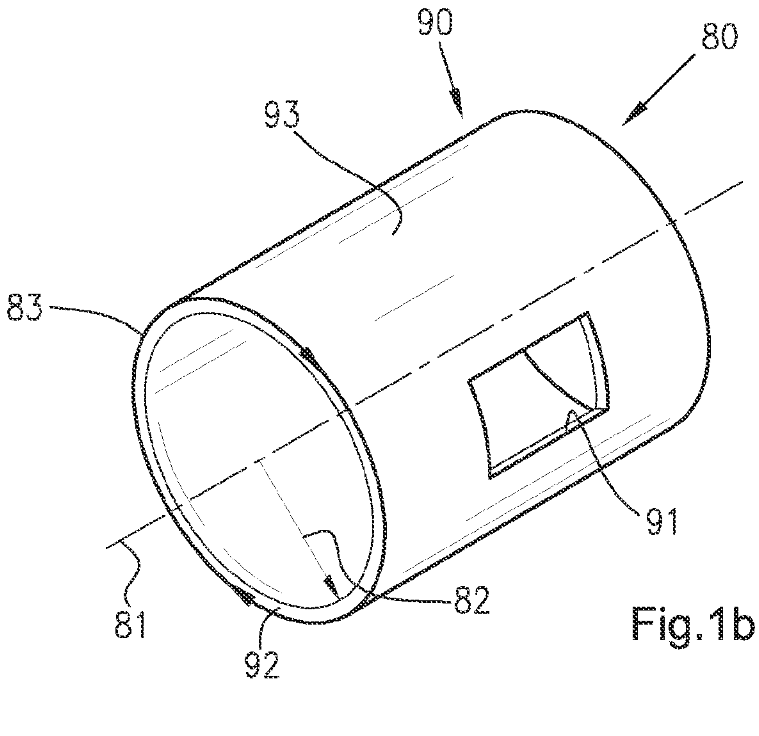
FIG. 1B is a perspective view of an object in the cylindrical coordinate system of FIG. 1A demonstrating spatial terminology used in the present application.

FIG. 1B is a perspective view of object 90 in cylindrical coordinate system 80 of FIG. 1A demonstrating spatial terminology used in the present application. Cylindrical object 90 is representative of a cylindrical object in a cylindrical coordinate system and is not intended to limit the present invention in any manner. Object 90 includes axial surface 91, radial surface 92, and circumferential surface 93. Surface 91 is part of an axial plane and surface 92 is part of a radial plane.

Figure 2:
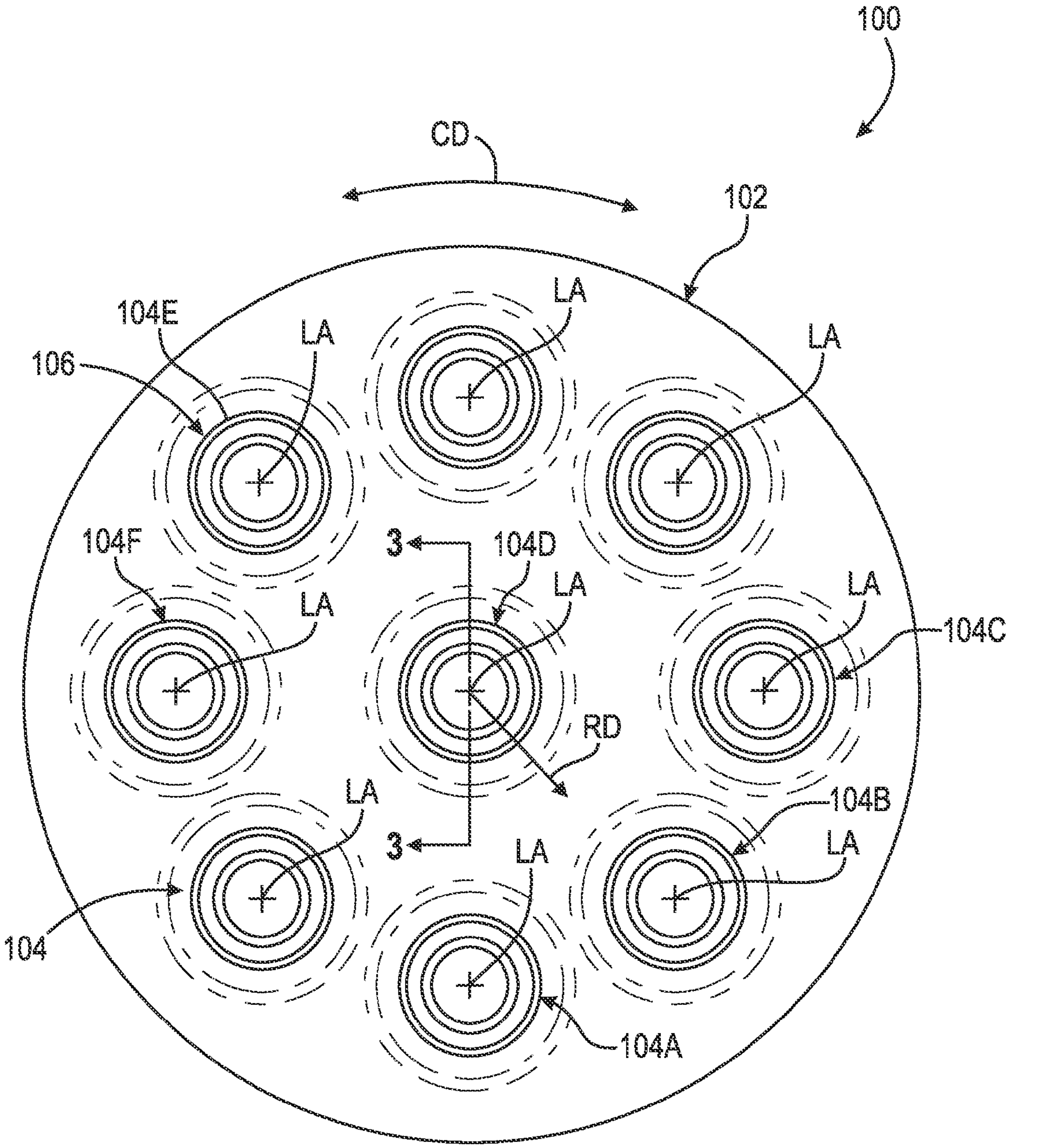
FIG. 2 is a front view of an apparatus for producing extreme ultra-violet (EUV) light.

FIG. 2 is a front view of apparatus 100 for producing extreme ultra-violet (EUV) light.

Figure 3:
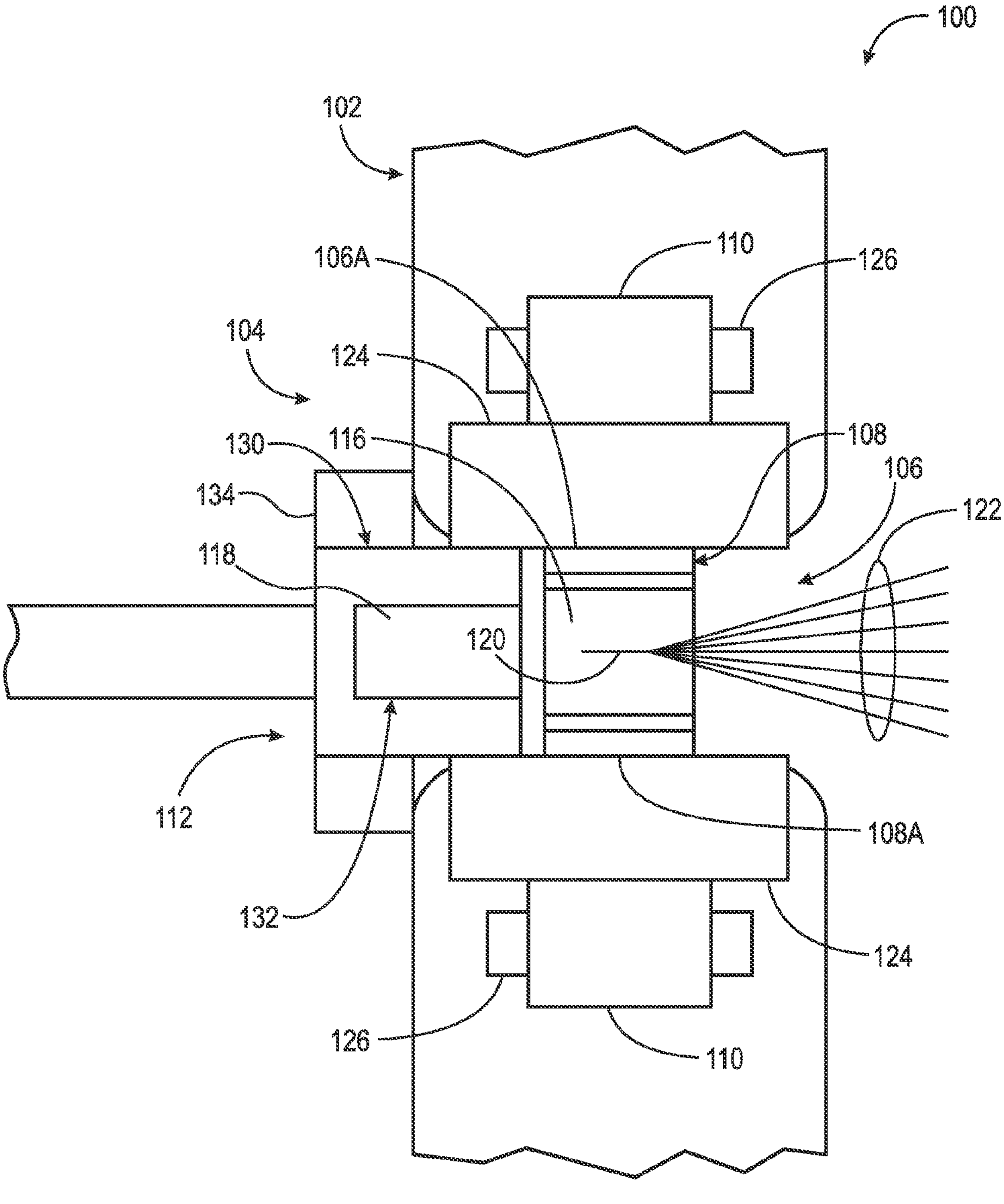
FIG. 3 is a cross-sectional view generally along line 3-3 in FIG. 2; and, FIG. 4 is a schematic block diagram of an apparatus for producing extreme ultra-violet (EUV) light.

FIG. 3 is a cross-sectional view generally along line 3-3 in FIG. 2. The following should be viewed in light of FIGS. 2 and 3. Apparatus 100 includes plate 102 and discharge plasma devices 104. Plate 102 includes through-bores 106. To simplify the presentation and avoid excessive use of the term "respective," the discussion that follows is directed to a single through-bore 106 and a single discharge plasma device 104. However, it should be understood that unless noted otherwise, the discussion is applicable to each through-bore 106 and discharge plasma device 104. Plate 102 can accommodate varying numbers of devices 104. Although a particular number and configuration of devices 104 are shown in FIG. 2, it should be understood that apparatus 100 is not limited to a particular number or configuration of devices 104.

Figure 4:
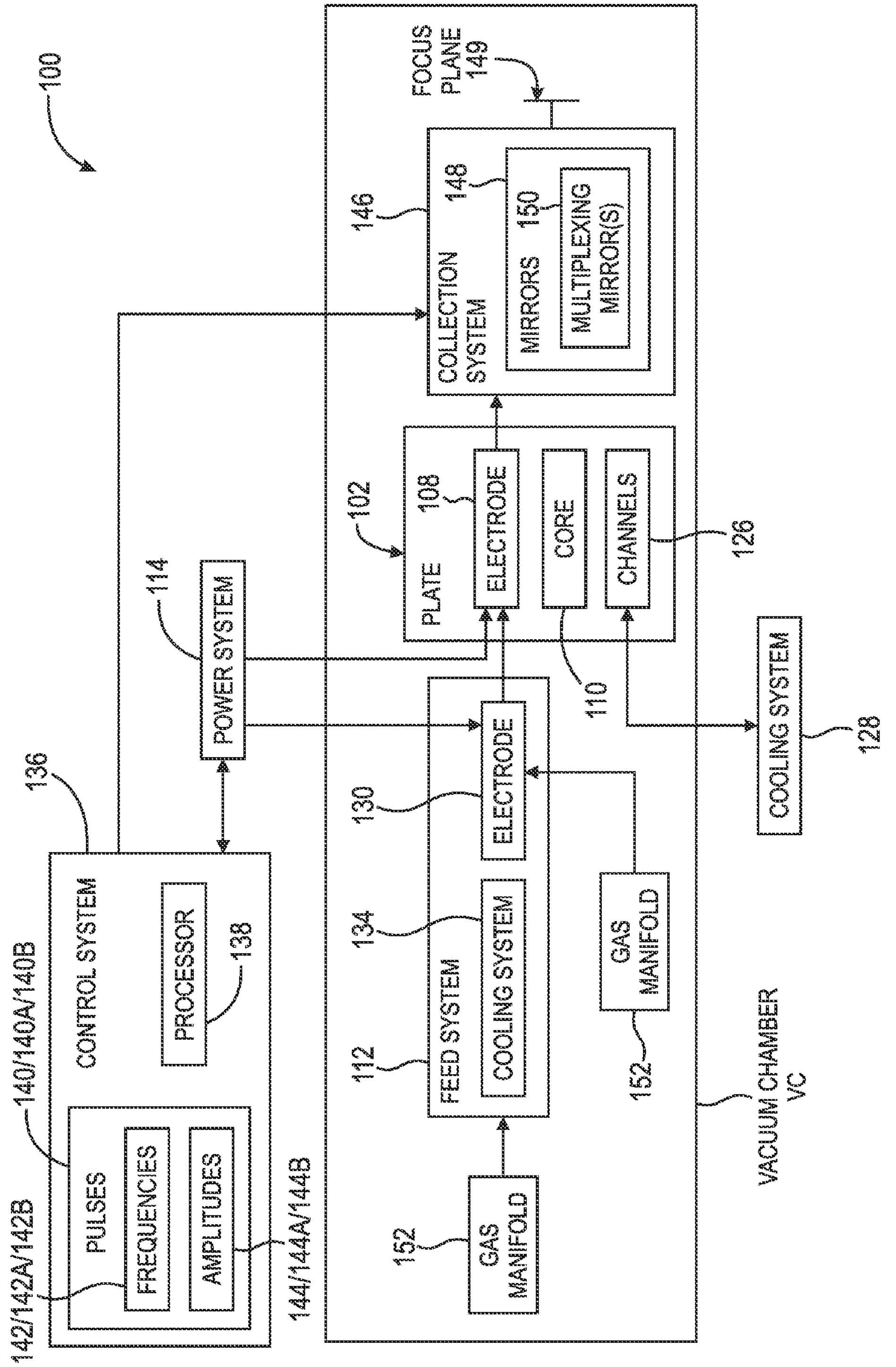

FIG. 4 is a schematic block diagram of apparatus 100 for producing extreme ultra-violet (EUV) light. The following should be viewed in light of FIGS. 2 through 4. A single device 104 is shown in FIG. 4; however, it should be understood that the discussion of FIG. 4 is applicable to each device 104 in apparatus 100. Through-bore 106 includes longitudinal axis LA. Discharge plasma device 104 is at least partially disposed in a through-bore 106 and includes plasma electrode 108, magnetic core 110, and feed system 112. Apparatus 100 includes at least one power system 114. In an example embodiment, apparatus 100 includes a single power system 114. In an example embodiment, apparatus 100 includes a respective power system 114 for each device 104. The discussion that follows is directed to the case in which apparatus 100 includes a single system, 114; however, it should be understood that the discussion is applicable to the case in which apparatus 100 includes a respective system 114 for each device 104.

A single electrode 108 is shown in FIG. 4 to simplify the presentation. However, it should be understood that the depiction in FIG. 4 is applicable to each device 104 included in apparatus 100.

Electrode 108 at least partially forms plasma-producing region 116. Magnetic core 110 is embedded in plate 102 and aligned with at least portion 108A of plasma electrode 108 in radial direction RD. Core 112 is configured to create a magnetic field within plasma-producing region 116. System 112 is arranged to supply ionizable material 118 to plasma-producing region 116. System 114 is configured to supply electrical power to plasma electrode 108 to create an electric field in plasma-producing region 116. The combination of the electric field and the magnetic field in plasma-producing region 116 creates plasma 120 from ionizable material 118 and initiate pinch (including z-pinch) type discharges. The discharges create EUV light 122. In an example embodiment, a single system 114 is used to supply each of the electrodes 108. In an example embodiment (not shown), each electrode as a separate system 114. In another embodiment, EUV light 122 is suitable for semiconductor reticle inspection systems, for example, EUV light 122 has a wavelength shorter than 15 nm.

In an example embodiment, magnetic core 110 wholly surrounds portion 108A in circumferential direction CD. In an example embodiment, discharge plasma device 104 includes ring 124 of material at least partially embedded in plate 102 and forming at least portion 106A of through-bore 106. In an example embodiment, ring 124 is removable from plate 102 while leaving the plate otherwise intact. For example, damage due to plasma 120 and light 122 is primarily limited to ring 124. Thus, when damage to ring 124 reaches a particular stage, the ring can be replaced without necessarily replacing other components in apparatus 100.

In an example embodiment, discharge plasma device 104, discharge plasma device includes channels 126 embedded in plate 102 and apparatus 100 includes cooling system 128 arranged to pump a cooling fluid through channels 126.

In an example embodiment, feed system 112 includes pre-ionizing electrode 130 at least partially disposed in through-bore 106 and including through-bore 132. Feed system 112 is arranged to supple ionizable material 118 to through-bore 132. Power system 114 is configured to supply and control electrical power to pre-ionizing electrode 130 to pre-ionize ionizable material 118 in through-bore 132. Feed system 112 is arranged to inject pre-ionized material 118 into plasma-producing region 116. Pre-ionized material 118 can be a solid or, as further described below, a gas.

In an example embodiment, feed system 112 includes cooling system 134 arranged to cool or freeze ionizable material 118 in through-bore 132. In an example embodiment, system 134 is part of system 128.

In an example embodiment, apparatus 100 includes control system 136 configured to control power to electrodes 108. In an example embodiment, system 136 includes processor 138. In an example embodiment, control system 136 is configured operate power system 114 to simultaneously provide electrical power to all of plasma electrodes 108 or to provide electrical power to plasma electrodes 108 in a predetermined sequence. In an example embodiment, providing electrical power to electrodes 108 in a predetermined sequence includes providing power to only one electrode 108 at a time. In an example embodiment, providing electrical power to electrodes 108 in a predetermined sequence includes providing power to more than one electrode 108 and less than all of electrodes 108 at a time.

The predetermined sequence can be any sequence known in the art. For example, starting with device 104A in FIG. 2, devices 104 can be sequentially powered in a circumferential direction, for example, a counter-clockwise direction. For example, device 104B is energized after device 104A is de-energized and device 104C is energized after device 104B is de-energized. Device 104D can be energized at any point in the preceding sequence. A similar pattern can be performed in a clockwise direction. Other possible patterns include star patterns. It should be understood that energizing a device 104 results in creation of plasma 120 and EUV light 122. The sequencing of devices 104 is helpful in eliminating cross talking or interference cause by a previously energized device 104.

For example, devices 104 can be non-sequentially powered in a circumferential direction. For example, device 104A is energized, device 104E is energized after device 104A is de-energized, device 104B is energized after device 104E is de-energized, and device 104F is energized after device 104B is de-energized. Device 104D can be energized at any point in the preceding sequence. A similar pattern can be performed in a clockwise direction.

In an example embodiment, control system 136 is configured to operate power system 114 to provide the electrical power in respective pulses 140 and to control respective frequencies 142 and amplitudes 144 of pulses 140. Control system 136 can vary the pulses in any manner known in the art. For example, control system 136 is configured to operate power system 114 to provide, to one electrode 108 electrical power in respective pulses 140A having frequency 142A and amplitude 144A, and provide to different electrode 108, electrical power in pulses 140B having frequency 142B and amplitude 144B. In an example embodiment, a single control system 136 is used for each of devices 104. In an example embodiment (not shown), each device 104 has a separate control system 136.

In an example embodiment, control system 136 is configured to operate power system 114 to provide, to a particular electrode 108 and at a first point in time, electrical power in respective pulses 140A having frequency 142A and amplitude 144A, and provide to the same electrode 108 and at a second point in time following the first point in time, electrical power in pulses 140B having frequency 142B and amplitude 144B.

It should be understood that in the above example, pulses 140A and 140B, frequencies 142A and 142B, and amplitudes 144A and 144B, respectively, differ from each other.

In an example embodiment, apparatus 100 includes collection system 146 with mirrors 148 arranged to focus EUV light 122 on single focus plane 149, for example, for use in a semi-conductor inspection system. In an example embodiment, mirrors 148 include at least one multiplexing mirror 150 displaceable to a plurality of positions to receive EUV light 122 directly from a plurality of discharge plasma devices 104. The discussion that follows is directed to a single mirrors 150; however, it should be understood that the discussion is applicable to a plurality of mirrors 150. For example, in one position mirror 150 receives light 122 from device 104A and in a second position mirror 150 receives light from device 104D.

As described above, control system 136 can be used to energize devices 104 in any sequence known in the art. In an example embodiment, control system 136 is configured synchronize the energizing of devices 104 in a predetermined sequence with displacement of multiplexing mirror 150 so that the multiplexing mirror is aligned with applicable devices 104 included in the predetermined sequence, as the devices are energized. Thus, mirror 150 is positioned to receive EUV light 122 from the applicable devices 104 in the predetermined sequence as each device 104 is energized.

In an example embodiment, ionizable material 118 includes at least one purified gas G and apparatus 100 includes gas manifold system 152, configured to inject a single gas G or a mixture of purified gases G to increase pressure in through-bore 132 to facilitate preionization of material 118 in through-bore 132. In an example embodiment, apparatus 100 includes a single gas manifold system. In an example embodiment, apparatus 100 includes a separate gas manifold system for each device 104.

In an example embodiment, cooling system 134 is arranged to cool or freeze the single purified gas G or the mixture of purified gases G in through-bore 132 to increase a density of the single purified gas G or the mixture of purified gases G in the respective second through-bore. Feed system 112 is arranged to inject the denser and preionized single purified gas G or mixture of purified gases G into plasma-producing region 116. The increased density enhances the preionization and EUV light producing operations. Material 118 and gas G can include, but are not limited to: Xenon, Lithium, Tin, and Krypton.

Apparatus 100 can be wholly or partially disposed in vacuum chamber VC, for example, a vacuum chamber for a reticle inspection system. A particular configuration, with respect to chamber VC, of component elements of apparatus 100 is shown in the figures; however, it should be understood that other configurations are possible.

Advantageously, apparatus 100, though the use of multiplexed devices 104, overcomes the problems noted above, which prevent the use of discharge plasma produced sources in reticle inspection systems. In particular, the use of multiple multiplexed devices 104 in a single plate 102 results in EUV light meeting the stricter brightness requirements for inspection systems by compensating for the lack of brightness and the lower repetition rate of the individual devices 104. For example, by combining the respective EUV light from multiple devices 104, a composite EUV light of sufficient brightness for a reticle inspection system is generated. By multiplexing the multiple devices 104, the EUV light from the multiple devices 104 is generated in a rapid sequence to generate the composite EUV light with sufficient continuity.

The use of respective power systems 114 and control systems 136 for each device 104 enable better stability and efficiency and independent tunable characteristics such as control of frequency 142 and pulse 144. The use of respective power systems 114 and control systems 136 for each device 104 also enable synchronization of EUV light generation with movement of multiplexing mirrors 148A, sensors or reticle inspection system requirements.

In an example embodiment, each gas G has a concentration of water less than 2 parts per million and a respective concentration level for each contaminant in a plurality of contaminants, less than 100 parts per billion. In an example embodiment, each gas G has a respective concentration level for each contaminant in a plurality of contaminants, less than 10 parts per billion. An example of contaminants and contaminant concentrations for gas or gases G is as follows:

1. Water: Max. concentration: <2 ppm; Ideal concentration: <2 ppm

2. $O_2$ and gases other than N: Max. concentration: <10 ppb; Ideal concentration: <1 ppb 3. CO and $CO_2$: Max. concentration: <1 ppb; Ideal concentration: <1 ppb 4. Volatile hydrocarbons (b.p. <150° C. or molecular mass <120 amu) Max. concentration: <1 ppb; Ideal concentration: <0.1 ppb 5. Non-volatile hydrocarbons (b.p. >150° C. or molecular mass <120 amu) Max. concentration: <1 ppb; Ideal concentration: <0.1 ppb 6. Total volatile acids, including $SO_2$, SOx. $H_2S$,HF, HCl, $NO_x$ and other nitrogen oxides,$Po_x$ and Phosphates species Max. concentration: <1 ppb; Ideal concentration: <0.4 ppb 7. Total volatile bases: NMP, $NH_3$ and amines Max. concentration: <1 ppb; Ideal concentration: <0.1 ppb 8. $SO_2$ and other S containing substances Max. concentration: <1 ppb; Ideal concentration: <0.1 ppb 9. Silicon organic compounds (siloxanes, silazanes and silanols) Max concentration: <0.1 ppb; Ideal concentration: <0.1 ppb 10. Refractory compounds including organophosphates and hydrocarbons containing F,S,P, Si, B, Se, Te or any metal Max. concentration: <10 ppb; Ideal concentration: <0.1 ppb Apparatus includes at least the following novel aspects:

1. Plate 102 includes a plurality of devices 104. A respective plasma discharge region is in the center of each device 104, is coincident with a respective magnetic core, and induces an electric current in plasma 120 sufficient to form a respective Z-pinch generating EUV light.

2. Each electrode 108 and power system 114 can have independent controllable and tunable characteristics for frequency 142 and pulse 144. In addition, magnetic parameters of respective magnetic cores can be individually tuned. The preceding tuning can be configured and synchronized with multiplexing mirrors 148A, sensors, or inspection system necessities.

3. Gas manifold 152 injects individual or mixed purified for producing a region of higher pressure with then can be preionized.

4. Gas(es) G is selectable to have cooling freezing capability to get a more dense material 118 and plasma 120.

5. The switching sequence for energizing devices 104 can be in any sequence known in the art. The sequencing overcomes the lack of brightness and low repetition rates of individual devices 104.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What I claim is:

1. An apparatus for producing extreme ultra-violet (EUV) light, comprising:

a plate including a first plurality of through-bores, each through-bore included in the first plurality of through-bores including a respective longitudinal axis;

a plurality of discharge plasma devices, each discharge plasma device at least partially disposed in a respective through-bore included in the first plurality of through-bores and including:

a respective plasma electrode at least partially forming a respective plasma-producing region;

a respective magnetic core embedded in the plate and aligned with at least a portion of the respective plasma electrode in a radial direction and configured to create a respective magnetic field within the respective plasma-producing region; and, a respective feed system arranged to supply an ionizable material to the respective plasma-producing region; and, at least one power system configured to supply electrical power to the respective plasma electrodes to create respective first electric fields in the respective plasma-producing regions, wherein:

for said each discharge plasma device, the combination of a respective first electric field and the respective magnetic field is arranged to create a respective plasma from the ionizable material, the respective plasma creating respective EUV light.

2. The apparatus of claim 1, wherein the combination of the respective first electric field and the respective magnetic field is arranged to create the respective plasma substantially contained within the respective plasma-producing region.

3. The apparatus of claim 1, wherein the respective magnetic core wholly surrounds the at least a portion of the respective first electrode in a circumferential direction.

4. The apparatus of claim 1, wherein:

said each discharge plasma device includes a respective ring of material at least partially embedded in the plate and forming at least a portion of the respective through-bore;

the respective ring of material is removable from the plate while leaving the plate otherwise intact; and, the respective electrode is engaged with the respective ring of material.

5. The apparatus of claim 1, wherein said each discharge plasma device includes respective channels embedded in the plate, the apparatus further comprising:

a cooling system arranged to pump a cooling fluid through the respective channels.

6. The apparatus of claim 1, wherein:

the respective feed system includes a respective pre-ionizing electrode at least partially disposed in the respective first through-bore and including a respective second through-bore;

the respective feed system is arranged to supply the ionizable material to the respective second through-bore;

the at least one power system is configured to supply electrical power to the respective pre-ionizing electrode to pre-ionize the ionizable material in the respective second through-bore; and, the respective feed system is arranged to inject the pre-ionized material into the respective plasma-producing region.

7. The apparatus of claim 6, wherein:

the ionizable material includes at least one purified gas, the apparatus further comprising:

a gas manifold device configured to inject:

a single purified gas, included in the at least one purified gas, into the respective second through-bore; or, a mixture of purified gases, included in the at least one purified gas, into the respective second through-bore, wherein:

the respective feed system is arranged to inject the single purified gas or the mixture of purified gases into the respective second through-bore to increase pressure in the respective second through-bore to facilitate the pre-ionizing of the at least one purified gas.

8. The apparatus of claim 1, wherein:

the ionizable material includes at least one purified gas; and, the respective feed system includes a respective cooling system, the apparatus further comprising:

a gas manifold device configured to inject as the ionizable material:

a single purified gas, included in the at least one purified gas, into the respective second through-bore; or, a mixture of purified gases, included in the at least one purified gas, into the respective second through-bore, wherein:

the respective cooling system is arranged to cool or freeze the single purified gas or the mixture of purified gases in the respective second through-bore to increase a density of the single purified gas or the mixture of purified gases in the respective second through-bore; and, the respective feed system is arranged to inject the denser single purified gas or mixture of purified gases into the respective plasma-producing region.

9. The apparatus of claim 1, wherein the respective feed system includes a respective cooling system arranged to cool or freeze the ionizable material in the respective second through-bore.

10. The apparatus of claim 1, further comprising:

a control system configured to operate the at least one power system to:

simultaneously provide electrical power to all of the respective plasma electrodes; or, provide electrical power to the respective plasma electrodes in a predetermined sequence.

11. The apparatus of claim 10, wherein providing electrical power to the respective plasma electrodes in a predetermined sequence includes providing power to only one respective plasma electrode at a time.

12. The apparatus of claim 10, wherein providing electrical power to the respective plasma electrodes in a predetermined sequence includes providing power to more than one respective plasma electrode and less than all of the respective plasma electrodes at a time.

13. The apparatus of claim 10, wherein the control system is configured to operate the at least one power system to:

provide the electrical power in respective pulses; and, control a respective frequency and amplitude of the respective pulses.

14. The apparatus of claim 13, wherein the control system is configured to operate the at least one power system to:

provide, to a first plasma electrode, first electrical power in respective first pulses having a first frequency and a first amplitude; and, provide, to a second plasma electrode, second electrical power in respective second pulses having a second frequency and a second amplitude.

15. The apparatus of claim 13, wherein the control system is configured to operate the at least one power system to:

provide, to a first plasma electrode at a first point in time, first electrical power in respective first pulses having a first frequency and a first amplitude; and, provide, to the first plasma electrode at a second point in time following the first point in time, second electrical power in respective second pulses having a second frequency and a second amplitude different from the first frequency and the first amplitude, respectively.

16. The apparatus of claim 1, wherein the at least one power system includes:

a single power system configured to supply electrical power to all of the respective plasma electrodes; or, a respective power system configured to supply electrical power to said each respective plasma electrode.

17. The apparatus of claim 1, further comprising:

a collection system including a plurality of mirrors arranged to focus the respective EUV light from the plurality of discharge plasma devices on a single focus plane.

18. The apparatus of claim 17, further comprising:

a control system, wherein:

the plurality of mirrors includes a multiplexing mirror displaceable to a plurality of positions to receive the respective EUV light directly from a plurality of discharge plasma devices;

the control system is configured to operate the respective power systems to:

provide electrical power to a second plurality of discharge plasma devices, included in the first plurality of discharge plasma devices, in a predetermined sequence; and, synchronize providing the electrical power to the second plurality of discharge plasma devices with the displacement of the multiplexing mirror so that the multiplexing mirror receives the respective EUV light from each discharge plasma devices in the predetermined sequence as said each device is energized.

19. An apparatus for producing extreme ultra-violet (EUV) light, comprising:

a plate including a first plurality of through-bores, each through-bore included in the first plurality of through-bores including a respective longitudinal axis;

a plurality of discharge plasma devices, each discharge plasma device at least partially disposed in a respective through-bore included in the first plurality of through-bores and including:

a respective plasma electrode at least partially forming a respective plasma-producing region;

a respective magnetic core:

embedded in the plate;

aligned with at least a portion of the respective plasma electrode in a radial direction orthogonal to the respective longitudinal axis;

wholly surrounding the at least a portion of the respective first electrode in a circumferential direction; and, configured to create a respective magnetic field within the respective plasma-producing region; and, a respective feed system arranged to supply an ionizable material to the respective plasma-producing region;

at least one power system configured to supply electrical power to the respective plasma electrodes to create respective first electric fields in the respective plasma-producing regions; and, a control system configured to operate the at least one power system to:

simultaneously provide electrical power to all of the respective plasma electrodes; or, provide electrical power to the respective plasma electrodes in a predetermined sequence, wherein:

for said each discharge plasma device, the combination of a respective first electric field and the respective magnetic field is arranged to create a respective plasma from the ionizable material, the respective plasma creating respective EUV light.

20. The apparatus of claim 19, wherein:

the respective feed system includes a respective pre-ionizing electrode at least partially disposed in the respective first through-bore and including a respective second through-bore;

the respective feed system is arranged to supple the ionizable material to the respective second through-bore;

the at least one power system is configured to supply electrical power to the respective pre-ionizing electrode to pre-ionize the ionizable material in the respective second through-bore; and, the respective feed system is arranged to inject the pre-ionized material into the respective plasma-producing region.

21. The apparatus of claim 19, wherein providing electrical power to the respective plasma electrodes in a predetermined sequence includes:

providing power to only one respective plasma electrode at one time; or, providing power to more than one respective plasma electrode and less than all of the respective plasma electrodes at one time.

22. The apparatus of claim 19, further comprising:

a collection system including a plurality of mirrors arranged to focus the respective EUV light from the plurality of discharge plasma devices on a single focus plane.

23. The apparatus of claim 22, wherein the plurality of mirrors includes a multiplexing mirror displaceable to a plurality of positions to receive the respective EUV light directly from more than one discharge plasma device.

24. A method for producing extreme ultra-violet (EUV) light, using an apparatus including a plate including a first plurality of through-bores, each through-bore included in the first plurality of through-bores including a respective longitudinal axis and a first plurality of discharge plasma devices, each discharge plasma device at least partially disposed in a respective through-bore included in the first plurality of through-bores and including a respective plasma electrode at least partially forming a respective plasma-producing region, the method comprising, for said each discharge plasma device:

creating, using a respective magnetic core embedded in the plate and aligned with at least a portion of the respective plasma electrode in a radial direction orthogonal to the respective longitudinal axis, a respective magnetic field within the respective plasma-producing region;

supplying, using a respective feed system, an ionizable material to the respective plasma-producing region;

supplying, using at least one power system, electrical power to the respective plasma electrodes;

creating respective first electric fields in the respective plasma-producing regions;

ionizing the ionizable material to the respective plasma-producing regions;

creating, from the ionizable material, respective plasma in the respective plasma-producing regions; and, creating, from the respective plasma, respective EUV light.

25. The method of claim 24, further comprising, for said each discharge plasma device:

injecting, using the respective feed system, the ionizable material into a respective pre-ionizing electrode;

supplying, using the at least one power system, electrical power to the respective pre-ionizing electrode;

generating a respective second electric field in the respective pre-ionizing electrode;

pre-ionizing the ionizable material in the respective pre-ionizing electrode; and, injecting, using the respective feed system, the pre-ionized material into the respective plasma-producing region.

26. The method of claim 25, wherein:

the ionizable material includes a plurality of gases; and, each gas in the plurality of gases has:

a concentration of water less than 2 parts per million; and, a respective concentration level for each contaminant in a plurality of contaminants, less than 100 parts per billion, the method further comprising:

injecting, using a gas manifold device, a gas included in the plurality of gases or a mixture of gases include in the plurality of gases into the respective pre-ionizing electrode;

cooling or freezing, using a respective cooling system, the gas or the mixture of gases in the respective pre-ionizing electrode;

increasing a density of the gas or the mixture of gases in the respective pre-ionizing electrode; and, injecting, using the respective feed system, the denser gas or the mixture of gases into the respective plasma-producing region.

27. The method of claim 26, wherein the respective concentration level for each contaminant in the plurality of contaminants, less than 10 parts per billion.

28. The method of claim 24, wherein:

the ionizable material includes a plurality of gases; and, each gas in the plurality of gases has:

a concentration of water less than 2 parts per million; and, a respective concentration level for each contaminant in a plurality of contaminants, less than 100 parts per billion, the method further comprising:

injecting, using a gas manifold device, a gas included in the plurality of gases or a mixture of gases included in the plurality of gases into the respective pre-ionizing electrode; and, increasing gas pressure in the respective pre-ionizing electrode.

29. The method of claim 28, wherein the respective concentration level for each contaminant in the plurality of contaminants, less than 10 parts per billion.

30. The method of claim 28, further comprising, freezing or cooling the ionizing material in the respective pre-ionizing electrode.

31. The method of claim 24, further comprising:

operating the at least one power system to:

simultaneously provide electrical power to all of the respective plasma electrodes; or, provide electrical power to the respective plasma electrodes in a predetermined sequence.

32. The method of claim 31, wherein providing electrical power to the respective plasma electrodes in a predetermined sequence includes:

providing power to only one respective plasma electrode at a time; or, providing power to more than one respective plasma electrode and less than all of the respective plasma electrodes at a time.

33. The method of claim 24, further comprising:

operating the at least one power system to:

provide the electrical power in respective pulses; and, provide the respective pulses at a respective frequency and amplitude.

34. The method of claim 33, further comprising:

operating the at least one power system to:

provide, to a first plasma electrode, first electrical power in respective first pulses having a first frequency and a first amplitude; and, provide, to a second plasma electrode, second electrical power in respective second pulses having a second frequency and a second amplitude.

35. The method of claim 33, further comprising:

operating the at least one power system to:

provide, to a first plasma electrode at a first point in time, first electrical power in respective first pulses having a first frequency and a first amplitude; and, provide, to the first plasma electrode at a second point in time following the first point in time, second electrical power in respective second pulses having a second frequency and a second amplitude.

36. The method of claim 24, further comprising:

focusing, using a collection system including a plurality of mirrors, the respective EUV light from the plurality of discharge plasma devices on a single focus plane.

37. The method of claim 36, further comprising:

displacing a multiplexing mirror, included in the plurality of mirrors, to a plurality of positions for the multiplexing mirror;

simultaneous with displacing the multiplexing mirror, supplying, using the respective feed systems, power to a second plurality of discharge plasma devices included in the first plurality of discharge devices;

creating, using each discharge plasma device included in the second plurality discharge plasma device, the respective plasma at a same respective time as the multiplexing mirror is in a respective position included in the plurality of positions; and, receiving, using the multiplexing mirror and at each respective position, the respective EUV light from said each respective discharge plasma device included in the second plurality of discharge plasma devices.

38. The method of claim 24, wherein:

the ionizable material includes a plurality of gases; and, each gas in the plurality of gases has:

a concentration of water less than 2 parts per million; and, a respective concentration level for each contaminant in a plurality of contaminants, less than 10 parts per billion, the method further comprising:

injecting, using a gas manifold device, one gas, less than all of the gases, or all of the gases includes in the plurality of gasses, into the respective pre-ionizing electrode; and, cooling or freezing the one gas, the less than all of the gases, or the all of the gases in the respective pre-ionizing electrode.

* * * * *